United States Patent Office
3,669,770
Patented June 13, 1972

3,669,770

METHOD OF MAKING ABRASION-RESISTANT METAL-COATED GLASS PHOTOMASKS

Nathan Feldstein, Kendall Park, N.J., assignor to RCA Corporation

No Drawing. Filed Feb. 8, 1971, Ser. No. 113,767
Int. Cl. C23f *17/00;* H05k *3/06*
U.S. Cl. 156—3 2 Claims

ABSTRACT OF THE DISCLOSURE

Method of making a large-area metal-coated glass article of the type which must resist abrasion, comprising forming a relatively thick pattern of metal on a transparent glass substrate by an electroless deposition of nickel-phosphorus on the substrate and hardening the nickel-phosphorus layer by heat treatment at temperatures not higher than about 250° C.

BACKGROUND OF THE INVENTION

In processes of forming a sheet-like pattern of an etchable material, such as making a metal screen which has a multitude of very accurately spaced and dimensioned openings, a sheet of the etchable material is coated with a photoresist layer. The photoresist layer is then flood-exposed by projecting light through a suitable photomask and the exposed photoresist is developed to produce a pattern of resist and openings corresponding to the final pattern desired. The sheet of etchable material, now coated with the resist pattern, is treated with a solution which is capable of etching the etchable material but not the resist, so as to produce the patterned product. Finally, the remaining resist is removed from the product.

The photomask is an important item in the making of the patterned metal article. Previously, photomasks have usually been either one of two distinct varieties. One of these consists of a layer of a photographic emulsion on a transparent substrate which may be either a glass plate or a sheet of synthetic resin. The photographic emulsion is developed to produce the pattern of opaque and transparent areas desired. Such emulsions are soft and easily scratched. The other type comprises a pattern of chromium deposited on a transparent glass substrate. The chromium may be deposited either by vacuum evaporation or by sputtering of a uniform film with subsequent etching to remove the unwanted portions. Such metal films are very scratch resistant but the equipment for either vacuum deposition or sputtering is expensive, especially for deposition on large area substrates.

In order to obtain high resolution and good image reproduction in the final pattern, the surface of the photomask is usually pressed firmly against the photosensitive resist coating in the process of making an exposure. The surface of the photoresist coating is normally not smooth and the surface of the photomask is subject to considerable abrasion. If the photomask is of the photographic emulsion variety, its surface becomes scratched and damaged by the contact, especially where the photomask is being used in making a large number of successive copies. The scratched photomask must either be repaired, or, if the damage is too extensive, it must be discarded. Keeping scratched photomasks in repair is a relatively expensive process requiring tedious hand labor.

Chromium type photomasks are not as subject to scratch damage as the photographic emulsion type is but the chromium photomask has other disadvantages. If the area of the photomask is relatively large, for example a couple of square feet, it is extremely difficult to obtain a chromium layer of uniform thickness by vacuum evaporation or sputtering techniques. Consequently, some parts of the photomask may be too thin to wear well or the pattern can not be adequately defined in the chromium layer. There is also a problem of adhesion. As the layer of chromium is made thicker to resist wear and to eliminate the possibility of pin holes, the surface of the coating becomes softer and easier to remove by abrasion. Also, the thicker coatings do not adhere as well to the glass substrate.

Most large-screen color television picture tubes include a so-called shadowmask comprising a thin sheet of metal provided with several hundred thousand accurately spaced and dimensioned holes to aid in guiding streams of electrons which are to impinge on phosphor dots on the viewing screen. Large size picture tubes have viewing screen diagonals of 23 inches and even greater. The shadowmask has an area correspondingly large. Consequently, in manufacturing the shadowmasks by an etching process, large area photomasks are employed. It has been found that emulsion type photomasks wear out rapidly in this process and the cost of their maintenance is relatively high. It is highly desirable that an improved photomask be used which requires less maintenance because it has a sufficiently hard surface and which is sufficiently uniform to meet the requirements of mass production.

OBJECTS OF THE INVENTION

One object of the invention is to provide an improved photomask or other article having a large surface area and where the mask or other article must be resistant to abrasion. A further object of the invention is to provide an improved metal-coated glass article having a hardened surface. Another object of the invention is to provide an improved method of making a photomask or other article which comprises a metal pattern on a transparent glass substrate.

DESCRIPTION OF PREFERRED EMBODIMENTS

The invention will be described with reference to making a photomask which is to be used in making shadow masks for large-screen color television picture tubes. However, the present process may readily be used in printed circuitry and semiconductor technologies.

The first step of the process is to take a flat glass plate and thoroughly clean one surface which is to be metallized. Cleaning may be accomplished using any one of several well known detergents, such as Sparkleen. After cleaning, the surface is thoroughly rinsed in deionized water. A further cleaning step may be used which comprises immersing the surface in a warm solution of sulfuric acid and potassium dichromate for about 5 minutes. The cleaned surface is again thoroughly rinsed.

Next, the cleaned surface is sensitized using a solution of stannous chloride acidified with hydrochloric acid. The sensitizing solution may be made by first making a concentrate consisting of 214 grams $SnCl_2 \cdot 2H_2O$ and 290 cc. conc. HCl. The actual sensitizing solution which is used in the process comprises 50 cc. of the concentrate diluted to 1 liter with water. A dip of the cleaned glass plate in the sensitizing solution for one or two minutes is sufficient. After the sensitization step, the plate is rinsed thoroughly with warm water.

The sensitized surface is next activated with a solution of palladium chloride. The activating solution consists of 1 gram per liter of palladium chloride and 1 cc. per liter of concentrated hydrochloric acid. The remainder of the solution is water. The plate is again rinsed with water after treatment with the activating solution for a brief period.

The activated surface is now plated with nickel by an electroless process. A stock plating bath is made up by dissolving 154 grams of $NiCO_3$ and 252 grams of sulfamic acid in sufficient water to make a liter of solution. This is a concentrate from which portions can be taken to make a working bath. The preferred working bath is made by taking 200 cc. of the concentrate and 25 grams of $NaH_2PO_2 \cdot H_2O$ and diluting to one liter with water. Thus, the preferred working bath consists essentially of about 31 grams $NiCO_3$, about 51 grams sulfamic acid and 25 grams $NaH_2PO_2 \cdot H_2O$ per liter. The bath is maintained at a pH of 4 to 5 and a temperature of about 50 to 70° C., preferably 60° C.

The sensitized and activated plate is immersed in this solution to provide a nickel-phosphorus plating about 1500 A. to 4000 A. in thickness. At 70° C., the plating will contain about 11% by weight phosphorus which is co-deposited with the nickel.

After the above deposition is completed, the plate is removed from the bath and thoroughly rinsed and then dried in warm air.

To improve the adhesion of the metal layer to the substrate so that it can be easily further processed, the dried plate is mildly baked at a temperature of about 100°–250° C. At a temperature of 250° C., baking time is preferably about 1 hour. If the baking is carried out at an appreciably higher temperature than 250° C., later etching away of unwanted metal is very difficult. If a lower temperature is used, baking time is longer and may be as long as several hours or more at 100° C.

Next, an overall coating of photoresist is applied to the nickel surface. This may be a positive type photoresist such as Shipley AZ–1350 or AZ–111. Alternatively, other negative or positive resists may be used. The photoresist is developed in a conventional manner to provide a pattern of photoresist dots. The uncovered nickel-phosphorus surface is then etched in 30 to 50% concentrated nitric acid until the nickel-phosphorus is removed from all areas not covered by the photoresist. The remaining photoresist is then removed with a solvent such as isopropyl alcohol or acetone, which exposes the pattern of nickel-phosphorus dots on the glass substrate. The nickel-phosphorus surface is hardened by baking in air at about 380° C. for about ½ hour.

In the above example, the entire thickness of nickel is deposited in a single plating step. The nickel may also be deposited in two steps or more, if desired. In this case, if a two-step plating process is used, all of the preliminary operation steps are carried out as described above up to the immersion in the electroless plating bath. Then an electroless plating step is carried out for about 5 minutes at pH 4 and 60° C., for example, so that about one-third the ultimate thickness of nickel desired is deposited.

The plate is then removed from the bath and rinsed with water after which it is dried and baked in air at about 250° C. for 1 hour.

Then the preplating steps are repeated, preferably including cleaning, sensitization and activation, after which the plate is again immersed in the same nickel plating bath. This time the plating is permitted to continue for about 10 to 15 minutes. After the second nickel-phosphorus deposition step, the plate is again removed from the bath, rinsed, and baked at about 250° C. for 1 hour.

As in the previous example, the nickel-phosphorus surface is coated with a positive photoresist, rinsed, the resist is developed, and the plate is etched with concentrated (30–50%) nitric acid. After etching is completed and the photoresist is removed, the plate receives a final baking at about 380° C. for one hour.

Nickel-phosphorus layers made by the process of the present invention have some unexpected improved properties. For example, layers of various thicknesses were tested with a General Electric Scrape Abrasion Tester, Model No. 5120403G1 having an Alphecon magnetic head assembly as stylus and a variable load. The following table shows the number of cycles of rubbing needed to damage the nickel coating.

TABLE 1

| Minutes plating, 70° C. and pH 5 | Optical density at 400 mμ | Thickness in angstroms | Abrasion test | |
|---|---|---|---|---|
| | | | Cycles | Load (grams) |
| 1 | 0.73 | 254 | 15 | 90 |
| 2 | 1.4 | 254 | 30 | 90 |
| 3 | 2.5 | 762 | 45 | 90 |
| 4 | | 1,016 | +250 | 90 |
| | | | +400 | 90 |
| 10 | 4.3 | 1,778 | +500 | 290 |
| 15 | 4.3 | 2,794 | +500 | 290 |

The above results show that as the thickness of the coating increased, it was much more resistant to abrasion damage. This is in contrast with the usual behavior of deposited metal layers which decrease in abrasion resistance as thickness increases.

The nickel layers were also compared, for abrasion resistance, with evaporated and sputtered chromium layers of comparable thickness with results shown in the table below. The same GE Scrape Abrasion Tester was used but a constant load of 200 gms. was employed.

TABLE 2

| Test samples | Coating thickness, angstroms | Cycles needed to remove coating |
|---|---|---|
| Electroless nickel: | | |
| Sample 1 | 1,000 | 100–105 |
| Sample 2 | 1,000 | 129–149 |
| Triple evaporated chromium | 900 | 9–50 |
| Double sputtered chromium | 1,200 | 44–58 |

The above comparison test shows that the hardened nickel coatings exceeded even evaporated and sputtered chromium layers in abrasion resistance. They are also non-peeling with few or no pin holes. When pin holes do form they can easily be repaired by a re-sensitization; activation and local application of plating solution. When pin holes appear in evaporated or sputtered layers they are much more difficult to repair using the same evaporation or sputtering equipment.

The method described above includes depositing metal over an entire surface of the substrate plate and then etching away the unwanted metal. However, an additive process can also be used in which the photoresist pattern is put down first by conventional masking, exposing and developing techniques and then nickel is electrolessly plated only on the uncovered glass areas where it is desired. The resist areas can be treated with a catalyst poisoning agent to prevent nickel from being deposited thereon. Alternatively, no poisoning agent need be used; nickel is deposited over both the photoresist and the openings. (For a discussion of selective electroless deposition see "Selective Electroless Plating Techniques: A Survey" by N. Feldstein, Plating, August 1970.) The nickel deposited on the resist will subsequently be removed when the resist is removed. If it is desired to deposit the nickel in more than one step, the incomplete article which comprises thin-layered nickel dots and photoresist network can be treated to a mild baking operation of about 100° C. which will not harm the photoresist. Then one or more further layers of nickel can be deposited selectively.

In the processes of the present invention, the nickel sulfamate-phosphorus bath has been found to provide unusually good adherence of relatively thick nickel-phosphorus layers. A number of other nickel baths such as those operating at room temperature and containing nickel sulfate or nickel chloride and a hypophosphite, or the nickel-boron type baths, do not provide good enough adherence on glass, especially for relatively thick layers. For example, the following bath, which is entirely satisfactory for depositing thin nickel layers on many types of insulating substrates, was found inadequate for making articles in accordance with the present invention:

$NiSO_4.6H_2O$-25 g./l.; $Na_4P_2O_7.10H_2O$-50 g./l.

$NaH_2PO_2.H_2O$-25 g./l.; and $NH_4OH$ to pH 10.6. So also was a nickel-boron bath having the same composition as above except that it had 1.5 g./l. of dimethylamine borane instead of 25 g./l. of $NaH_2PO_2.H_2O$. When the bath composition is varied in this manner, phosphorus content of the coating varies between about 8 and about 13% by weight.

In addition to use of baths containing nickel and phosphorus, the method of the present invention may also be practiced using baths containing minor amounts of alloying metals such as tungsten or molybdenum.

I claim:

1. A method of making an article of the type including a glass substrate and a nickel coating on a surface of said substrate that must be relatively hard and resistant to abrasion, comprising:

thoroughly cleaning a surface of said glass substrate;
sensitizing said cleaned surface with an acidic solution of stannous chloride;
activating the sensitized surface with nuclei of a metal which is catalytic for the deposition of nickel from an electroless autocatalytic bath;
contacting the activated surface with an electroless nickel-phosphorus bath comprising nickel sulfamate and hypophosphite ion to deposit an opaque nickel coating having a thickness of at least about 1500 A.;
baking the metal layer at a temperature of about 100°–250° C.;
depositing a pattern of resist on said nickel coating;
etching away those portions of said nickel coating not covered by said resist pattern;
removing the remaining portions of said resist; and
baking the pattern of nickel remaining at a temperature of about 380° C. for at least about ½ hour.

2. A method of making an article of the type including a glass substrate and a nickel coating on a surface of said substrate that must be relatively hard and resistant to abrasion, comprising:

(a) cleaning said substrate to remove any impurity film;
(b) sensitizing said cleaned substrate with an acidic solution of stannous chloride;
(c) activating the sensitized surface with nuclei of a metal which are catalytic for the deposition of nickel from an electroless autocatalytic bath;
(d) contacting the activated surface with an electroless nickel bath comprising nickel sulfamate and hypophosphite ion to deposit a nickel coating having a thickness of at least about 500 A.;
(e) rinsing the nickel coated surface to remove all traces of the plating bath;
(f) baking the coated surface at about 250° C. for about 1 hour;
(g) repeating steps (a) through (f);
(h) applying a pattern of photoresist over the nickel coating;
(i) etching away those portions of the nickel coating not covered with photoresist;
(j) removing the remaining portions of said resist; and
(k) baking the pattern of nickel remaining at a temperature of about 380° C. for at least about ½ hour.

References Cited

UNITED STATES PATENTS

| | | | |
|---|---|---|---|
| 2,836,510 | 5/1958 | Bolin | 117—130 E |
| 3,192,136 | 6/1965 | Reid | 156—3 X |
| 3,379,556 | 4/1968 | Chiecchi | 117—47 A |

JACOB H. STEINBERG, Primary Examiner

U.S. Cl. X.R.

156—6; 117—47 A, 35, 211, 160 R, 130 E